United States Patent [19]
Carlson

[11] 4,196,438
[45] Apr. 1, 1980

[54] ARTICLE AND DEVICE HAVING AN AMORPHOUS SILICON CONTAINING A HALOGEN AND METHOD OF FABRICATION

[75] Inventor: David E. Carlson, Yardley, Pa.

[73] Assignee: RCA Corporation, New York, N.Y.

[21] Appl. No.: 727,659

[22] Filed: Sep. 29, 1976

[51] Int. Cl.² .................... H01L 29/48; H01L 27/14
[52] U.S. Cl. .................... 357/15; 136/89 TF; 148/174; 357/2; 357/30; 427/39; 427/84; 427/85
[58] Field of Search .......... 357/2, 30, 15, 61, 63; 427/39, 84, 85; 136/89 TF; 148/174

[56] References Cited

U.S. PATENT DOCUMENTS

| | | | |
|---|---|---|---|
| 3,424,661 | 1/1969 | Androshuk et al. | 427/39 |
| 3,914,856 | 10/1975 | Fang | 357/30 X |
| 3,922,774 | 12/1975 | Lindmayer et al. | 357/30 X |
| 3,961,997 | 6/1976 | Chu | 357/59 X |
| 3,978,333 | 8/1976 | Crisman et al. | 357/30 X |
| 4,068,020 | 1/1978 | Reuschel | 427/85 |
| 4,069,492 | 1/1978 | Pankove et al. | 357/2 |

OTHER PUBLICATIONS

Carlson et al., "Amorphous Silicon Solar Cell", *Applied Physics Letters*, vol. 28, No. 11, Jun. 1, 1976, pp. 671-673.

Chittick, "Properties of Glow-Discharge Deposited Amorphous Germanium and Silicon", *J. of Non-Crystalline Solids 3* (1970), North Holland Publishing Co., pp. 255-270.

Fuhs et al., "Heterojunctions of Amorphous Silicon and Silicon Single Crystals", *AIP Conference Proceedings No. 20*, Yorktown Heights 1974, pp. 345-350.

Stuke et al., "Amorphous and Liquid Semiconductors", *Proceedings of the Fifth International Conf. on Amorphous and Liquid Semiconductors*, Sep. 3-8, 1973, pp. 1-6.

*Primary Examiner*—Stanley D. Miller, Jr.
*Assistant Examiner*—James W. Davie
*Attorney, Agent, or Firm*—Birgit E. Morris; A. Stephen Zavell

[57] ABSTRACT

An amorphous silicon capable of the formation of a semiconductor junction. The amorphous silicon can be fabricated by a glow discharge in a gas atmosphere including hydrogen and a deposition gas. The deposition gas has therein the elements silicon and a halogen selected from the group consisting of chlorine, bromine and iodine.

30 Claims, 3 Drawing Figures

ARTICLE AND DEVICE HAVING AN AMORPHOUS SILICON CONTAINING A HALOGEN AND METHOD OF FABRICATION

BACKGROUND OF THE INVENTION

The present invention relates to a layer of amorphous silicon and, more particularly, to a layer of amorphous silicon having therein a halogen selected from the group consisting of chlorine, bromine and iodine.

It has recently been discovered that inexpensive and efficient photovoltaic and current rectifier devices can be fabricated having very thin bodies of amorphous silicon prepared by a glow discharge in silane. As is well known to those skilled in the art, photovoltaic devices such as solar cells and photodetectors are capable of converting light, i.e. infrared through the ultraviolet range, into usable electrical energy. A problem encountered in the field of photovoltaic devices is that the cost of producing electrical energy from such devices is often not competitive with other means of electrical generation. The use of thin bodies fabricated by a glow discharge in silane has helped in reducing the semiconductor material expense involved in the manufacture of such devices. Furthermore, the utilization of bodies of amorphous silicon fabricated by a glow discharge in silane can have the same cost reduction effect on current rectification devices. Bodies of amorphous silicon fabricated by a glow discharge in silane have properties making them ideally suited for photovoltaic devices and have also demonstrated current rectification properties in the dark. If amorphous silicon bodies can be made by a glow discharge in gas atmospheres other than silane, which also happen to be less expensive than silane, this further cost reduction would be most desirable in the field of amorphous silicon devices.

SUMMARY OF THE INVENTION

An article having a layer of amorphous silicon on a substrate, the layer is capable of the formation of a semiconductor junction, said layer containing a halogen selected from the group consisting of chlorine, bromine and iodine, said halogen being present in an amount up to about 7 atomic percent.

DETAILED DESCRIPTION OF THE INVENTION

Figure 1:
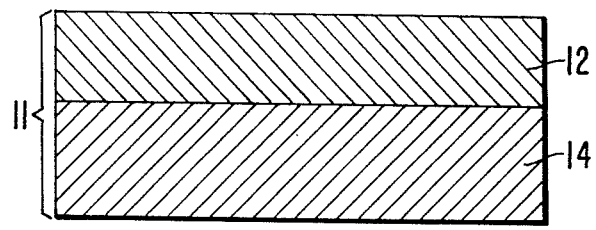
FIG. 1 is a cross-sectional view of a layer of amorphous silicon of the present invention on a substrate.

Referring to FIG. 1, an article 11 having a layer of amorphous silicon of the present invention is designated as 12. The layer 12 contains a halogen selected from the group consisting of chlorine, bromine and iodine in an amount up to about 7 atomic percent of the layer 12. Typically, the layer 12 is fabricated by a glow discharge in a gas atmosphere including hydrogen and a deposition gas containing the elements silicon and a halogen selected from the group consisting of chlorine, bromine and iodine.

The layer of amorphous silicon 12 possesses an average density of defect states within the energy gap lower than that found in amorphous silicon made by other methods such as sputtering, chemical vapor deposition (CVD) and evaporation. This low density of energy gap states makes possible the formation of semiconductor junctions, e.g. P-N, PIN, Schottky barrier and heterojunctions, within or at the amorphous silicon layer 12 of the present invention. It is well known to those skilled in the art that amorphous silicon fabricated by sputtering, evaporation or chemical vapor deposition possesses a large density of defect states in the energy gap, causing these materials to have poor electrical properties and to be unsuitable for the active region of semiconductor devices. In addition, the amorphous silicon of the present invention differs from amorphous silicon fabricated by a glow discharge in substantially pure silane, $SiH_4$, in that it contains a halogen element which is not present in the prior art amorphous silicon.

The layer 12 is on a surface of a substrate 14 of the article 11. The substrate 14 is of a material compatible with the glow discharge deposition of the layer 12. Typically, substrate 14 is of a material such as stainless steel, niobium, tantalum, and other materials which are not chemically attacked by the glow discharge atmosphere.

It is believed that the hydrogen in the glow discharge gas atmosphere plays an important role in assuring the good electrical properties of the amorphous silicon of layer 12, i.e., semiconductor junction formation. The hydrogen apparently helps to getter the halogen so that the amorphous silicon body contains only a small amount of the halogen, i.e., about 7 atomic percent of less. If the halogen content is too high, the electrical properties of the amorphous silicon will be adversely affected. Furthermore, the hydrogen reacts with any dangling bonds that might exist in the bulk amorphous silicon layer 12. Thus, it has been discovered that a superior quality amorphous silicon is fabricated if the volume ratio of hydrogen to the deposition gas is maintained at 2:1 or greater during deposition.

Figure 2:
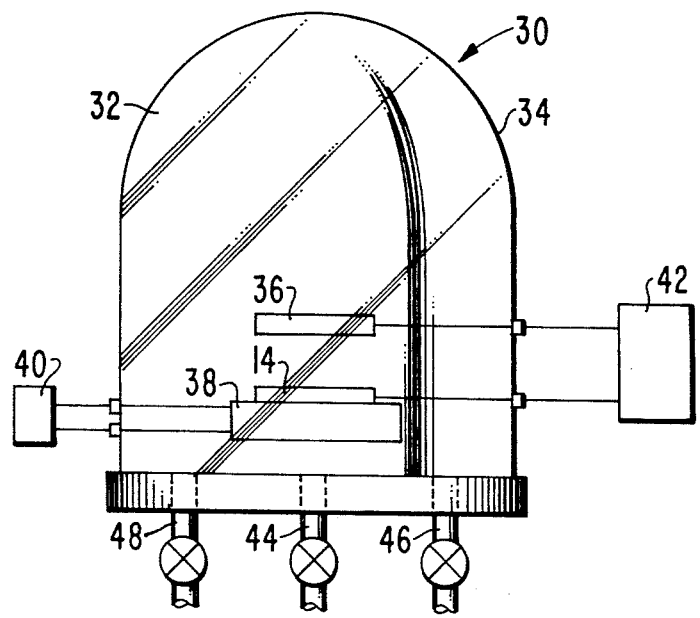
FIG. 2 is a schematic view of an apparatus for carrying out the fabrication of the amorphous silicon of the present invention.

Referring to FIG. 2, a glow discharge apparatus suitable for carrying out the fabrication of the layer 12 of the present invention is generally designated as 30. The glow discharge apparatus 30 includes a chamber 32 defined by a vacuum bell jar 34, typically of a glass material. In the vacuum chamber 32 is an electrode 36, and a heating plate 38 spaced from and opposite the electrode 36. The electrode 36 is of a metallic material having good electrical conductivity such as platinum, and is in the form of a screen or coil. The heating plate 38 is suitably a ceramic frame which encloses heating coils that are energized from a current source 40, external to the vacuum chamber 32.

A first outlet 44 into the vacuum chamber 32 is connected to a diffusion pump, a second outlet 46 is connected to a mechanical pump, and a third outlet 48 is connected to a gas bleed-in system which is the source of the various gases utilized in the glow discharge process. While the first outlet 44 is described as being connected to a diffusion pump, it is anticipated that a diffusion pump may not be necessary since the mechanical pump connected to the second outlet 46 may evacuate the system to a sufficient pressure.

In the fabrication of the layer 12, the substrate 14, e.g. stainless steel, is placed on the heating plate 38. The substrate 14 is connected to one terminal of the power source 42 and the electrode 36 is connected to an opposite terminal of the power source 42. A voltage potential therefor exists between the electrode 36 and substrate 14 when the power source 42 is energized. The power source 42 can be either D.C., A.C., i.e. in the low frequency range for example 60 Hertz, or it can be R.F., i.e. in the high frequency range, for example on the order of megahertz. Typically, when the power source 42 is D.C. the electrode 36 is connected to the positive terminal of the power souce 42, and the substrate 14 is connected to the negative terminal of the power source 42. Thus, the electrode 36 functions as an anode and the substrate 14 functions as a cathode when the power souce 42 is energized. This is referred to as the cathodic D.C. mode of operation. However, in D.C. operation the substrate 14 and the electrode 36 can be of the opposite polarities as described, i.e., the substrate 14 can be the anode and the electrode 36 can be the cathode in which instance the D.C. operation is referred to as an anodic D.C. mode of operation. Furthermore, R.F. glow discharge operation can be accomplished in an electroless glow discharge apparatus of the type well known to those in the art, e.g. a capacitance R.F. glow discharge system and an inductive R. F. glow discharge system. However, more uniform deposition over a large area, i.e. greater than 10 cm$^2$, is attained in D.C. or A.C. glow discharge than in electroless R.F. glow discharge.

The vacuum chamber 32 is typically evacuated to a pressure of about $10^{-3}$ to $10^{-6}$ torr, and the substrate 14 is heated to a temperature in the range of 150° C. to 450° C. by energizing the heating coils of the heating plate 38. An atmosphere containing hydrogen and a deposition gas containing the elements silicon and a halogen selected from the group consisting of chlorine, bromine and iodine, is bled into the vacuum chamber 32 through the third outlet 48 under a pressure of 0.1 to 5.0 torr. The deposition gas can be, for example, dichlorosilane ($SiH_2Cl_2$), chlorosilane, ($SiH_3Cl$), trichlorosilane ($SiHCl_3$), bromosilane ($SiH_3Br$), dibromosilane ($SiH_2Br_2$) and silicon tetrachloride ($SiCl_4$). For the purpose of describing the fabrication of the present invention the deposition gas is dichlorosilane. As a result of bleeding in the hydrogen and dichlorosilane atmosphere, the temperature of the substrate 14 is raised to the range of 200° C. to 500° C. since additional heat can now radiate to the substrate 14 through the gas atmosphere. As previously stated, a superior quality layer 12 can be fabricated if the volume ratio of hydrogen to deposition gas is 2:1 or greater. However at very high ratios, i.e. 40:1, the deposition rate becomes very low, on the order of one micron per hour.

To initiate the glow discharge between the electrode 36 and substrate 14, the power source 42 is energized, thereby commencing the deposition of the amorphous silicon layer 12. The D.C. cathodic mode of operation is assumed. For deposition of the body 12 onto a surface of the substrate 14, the current density at the surface of the substrate 14 should be in the range of 0.1 to 0.3 ma/cm$^2$. The deposition rate of the amorphous silicon increases with increasing atmospheric pressure and current density. Deposition of a one micron thick layer 12 can occur in several minutes if for example, the chamber 32 atmosphere is at a pressure of about 2 torr, the current density at the surface of the substrate 14 is at about 1 ma/cm$^2$, and the substrate 14 is at a temperature of about 350° C.

The layer 12 of amorphous silicon of the present invention has electrical properties which make it suitable for the semiconductor layer of semiconductor photovoltaic, photodetector and current rectification devices.

For the purpose of more particularly describing the present invention a Schottky barrier photovoltaic device having a layer of amorphous silicon of the present invention is subsequently described in FIG. 3 and is designated as 110. It is obvious to those skilled in the art that the layer of amorphous silicon of the present invention can also be utilized in other semiconductor photovoltaic, photodetector, and rectification devices which have a semiconductor junction such as a P-N junction, a PIN junction, or a heterojunction.

Figure 3:
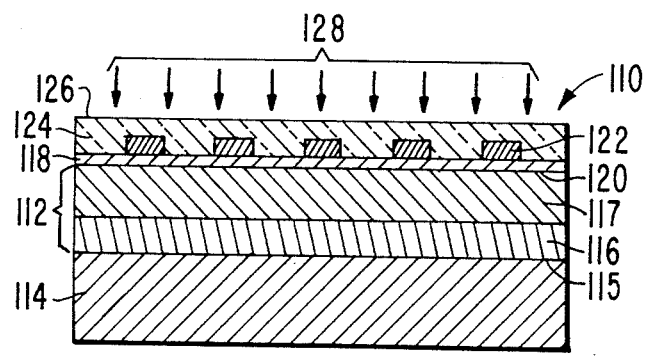
FIG. 3 is a cross-sectional view of a Schottky barrier semiconductor device utilizing the amorphous silicon of the present invention.

Referring to FIG. 3, the Schottky barrier photovoltaic device 110 includes a substrate 114 of a material having good electrical conductivity properties. Material having this capabilityare typically stainless steel, niobium, tantalum, and other materials that are not chemically attacked by the glow discharge atmosphere. On a surface of the substrate 114 is a layer 112 of amorphous silicon fabricated according to the present process. The layer 112 includes a first layer 116 which is in contact with the substrate 114, with an interface 115 therebetween.

The first layer 116 is doped amorphous silicon. Thus, the glow discharge gas atmosphere from which the first layer 116 is fabricated also includes a dopant gas, e.g. phosphine ($PH_3$). The first layer 116 is capable of having an ohmic contact with the substrate 114. On a surface of the first layer 116 opposite the substrate 114 is a second layer 117 of amorphous silicon. The second layer 117 is not doped; however, it has been discovered that the amorphous silicon of the second layer 117 is slightly N type.

Preferably, the dopant concentration of the first layer 116 is graded such that the concentration of the dopant is a maximum at the interface 115 and decreases to an electrically insignificant concentration at the interface of the first layer 116 and the second layer 117. Although it is preferred that the first layer 116 have a graded doping concentration, for reasons subsequently set forth, it is also anticipated that the dopant concentration can be uniform throughout the first layer 116.

The first layer 116 is typically in the range of 100 Å to about 0.5 micron in thickness and the second layer 118 is typically about 0.5 to 1 micron in thickness.

On a surface of the second layer 117, opposite the first layer 116 is a metallic film 118, with interface 120 therebetween. The contacting of the metallic film 118 and second layer 117 results in a Schottky barrier at the interface 120. The metallic film 118 is at least semitransparent to solar radiation. To assure the forming of a Schottky barrier the metallic material of film 118 has good electrical conductivity and has a high work function, i.e. greater than 4.5 eV, assuming the second layer 117 is of slightly N type conductivity. Metallic materials having good electrical conductivity and a high work function, include for example, gold, platinum, palladium, rhodium, iridium and chromium. The metallic film 118 may be a single layer of a metal or it may be multi-layered. If the film 118 is multi-layered, the initial layer on second layer 117 should assure a Schottky barrier while a layer on the initial layer should provide good electrical conductivity. For example, if the metallic film 118 is multi-layered, an initial layer could be of platinum on the second layer 117 with a layer of gold on the initial platinum layer. As stated previously, the metallic film 118 is semitransparent to solar radiation, and since it is a metal, it should have a maximum thickness of about 100 Å to assure semitransparency.

On a portion of the surface of the metallic film 118, opposite the interface 120, is an electrode 122. Typically, the electrode 122 is of a metal having good electrical conductivity and is in the shape of a grid, although it can be of other shapes well known to those in the art, e.g. finger or comb shape. The electrode 112, for purposes of disclosing a preferred embodiment of the present invention, has two sets of grid lines, with the grid lines of each set substantially parallel to each other and intersecting the grid lines of the other set. The electrode 122 occupies only a small area of the surface of the metallic film 118, i.e. about 5 to 10% of the film 118 surface, since solar radiation impinging the electrode 122 may be reflected away from the device 110. The function of the electrode 122 is for the uniform collection of current from the metallic film 118, and thus facilitates in keeping the series resistance of the device 110 low when in operation as part of a circuit.

An antireflection layer 124 is disposed over the electrode 122 on the remaining surface of the metallic film 118 opposite the interface 120. The antireflection layer 124 has an incident surface 126 opposite the metallic film 118, on which solar radiation 128 is capable of impinging. As is well known in the art, the antireflection layer 124 will bring about an increase in the amount of solar radiation 128 traversing the metallic film 118 provided that the antireflection layer 124 is of a thickness on the order of $\lambda/4n$ wherein "$\lambda$" is the wavelength of the radiation impinging the incident surface 126, and "$n$" is the index of refraction of the antireflection layer 124. In essence, the antireflection layer 124 reduces the amount of light that will be reflected from the device 110.

It is obvious to those skilled in the art that the index of refraction, "$n$", should be of an appropriate value to increase the amount of solar radiation 128 traversing the metallic film 118. For example, if the metallic film 118 is platinum, 50 Å in thickness, a suitable antireflection layer 124 would be of zirconium dioxide, about 450 Å in thickness with $n=2.1$. Usually, the antireflection layer 124 is a dielectric material such as zinc sulfide, zirconium oxide, or silicon nitride, but can also be a transparent semiconductor material such as tin oxide doped with antimony or indium oxide doped with tin.

In the field of semiconductor devices, it is well known that a surface barrier junction, generally known as a Schottky barrier, is formed as a result of contacting certain metals to certain semiconductor materials. As previously stated, in the Schottky barrier photovoltaic device 110, the barrier junction is at the interface 120 as a result of contacting the metallic film 118 to the second layer 117. A Schottky barrier generates a space charge field into the material of the device 110 from the interface 120 which penetrates into the second layer 117 and is referred to as the depletion region. Associated with the depletion region is an electric field also in the second layer 117. Furthermore, as a result of the graded doping concentration of the first layer 116 an electric field is created in the first layer 116. Therefore, with the Schottky barrier at the interface 120 and the graded doping concentration of the first layer 116 an electric field extends essentially through both the first and second layers 116 and 117. It is preferable, at least for photovoltaic devices, that the electric field extend through the first and second layers 116 and 117. With the electric field extending through the first and second layers 116 and 117, carriers created anywhere within these layers as a result of the absorption of solar radiation 128 are swept by the electric field to either the substrate 114 or the metallic film 118. The substrate 114 functions as one of the electrodes of the device 110. If the electric field does not extend into a portion of the first or second layers 116 and 117, any carriers generated in this quasi-neutral region would not be swept to an electrode by means of the field and must rely on diffusion to the depletion region in order to be collected. Also, any quasi-neutral region may contribute to series resistance when drawing current from the device 110 and lower device efficiency.

While the graded doping concentration of the first layer 116 is advantageous in lengthening the electric field region of the device 110, it further assists in more readily forming an ohmic contact between the first layer 116 and the substrate 114 because the doping concentration is at its maximum at the first interface 115, i.e. on the order of 5 atomic percent. The forming of an ohmic contact at interface 115 is advantageous in assuring a low series resistance for the photovoltaic device 110. Even if the first layer 116 has a uniform doping concentration throughout, an ohmic contact can be formed at interface 115 as long as the uniform doping concentration is rather high, i.e. on the order of 5 atomic percent.

In the fabrication of the photovoltaic device 110 the power source 42 is electrically connected to the apparatus 30, the vacuum chamber 32 is evacuated and the substrate heated as previously described for article 11. An atmosphere of hydrogen, a deposition gas such as dichlorosilane, and an N type doping gas are bled into the vacuum chamber 32 to a pressure of 0.1 to 5.0 torr. The dopant gas will be about 1.5% by volume of the vacuum chamber 32 atmosphere. Typically, N type dopant gases which may be utilized are phosphine, $PH_3$, and arsine, $AsH_3$.

The glow discharge is initiated for the deposition of the first layer 116. To grade the dopant concentration of the first layer 116 additional hydrogen and deposition gases are bled into the vacuum chamber 32 during the glow discharge deposition thereby decreasing the dopant concentration. After deposition of the first layer 116 the atmosphere in the vacuum chamber 32 is pumped out by the mechanical pump 46. With the vacuum chamber 32 pumped out and brought to a pressure of about $10^{-6}$ torr, hydrogen and dichlorosilane are then bled into the vacuum chamber 32 at a pressure in the range of 0.1 to 5.0 torr. Again a glow discharge is initiated with a current density at the surface of the first layer 116 in the range of 0.3 ma/cm$^2$ to 3.0 ma/cm$^2$, thereby commencing the deposition of the second layer 117.

As is known to those in the art, the temperature of the substrate 114 in the glow discharge process may influence the composition and structure of the material deposited thereon due to the effects of auto doping, eutectic formation and induced crystallization.

After deposition of the first and second layers 116 and 117, the layer 112 can be annealed by subjecting it to a temperature in the range of 200° C. to 400° C. for a period of from a few minutes to several hours. A longer period will be required only for the lower annealing temperatures. Typically, annealing can be accomplished by leaving the layer 112 in the glow discharge apparatus 30 after the glow discharge is terminated or by placing the layer 112 in an annealing furnace. It is believed that this processing step anneals out defects in the amorphous silicon body and has been found to improve device efficiency.

Next, the layer 112 is placed in a conventional evaporation system, e.g. an electron-beam evaporation system, and the metallic film 118 is evaporated onto the second layer 117. Likewise, the electrode 122 and antireflection layer 124 are deposited on the metallic film 118 by conventional evaporation and masking techniques. The entire processing may be accomplished in a single system for accommodating both glow discharge and evaporation. Further, it has been discovered that when the photovoltaic device 110 having a metallic film 118 of material selected from the group consisting of chromium, iridium, rhodium, platinum, or palladium is subjected to a heat treatment during fabrication, the collection efficiency of the device increases. Typically the heat treatment is done after the antireflection layer 124 is deposited, or prior to deposition of the electrode 122 and after deposition of the antireflection layer 124. Specifically, the heat treatment involves subjecting the device 110 to a temperature in the range of about 150° C. to 250° C. for about 5 to 30 minutes. The heat treatment can be done in a vacuum or in a forming gas atmosphere, e.g. 90% nitrogen and 10% hydrogen by volume, or in an atmosphere of pure nitrogen, or pure hydrogen. The heat treatment increased device efficiency by increasing Schottky barrier height, improving collection efficiency and reducing the effective series resistance of the device.

Fabrication of the photovoltaic device 110 is completed by connecting wire electrodes (not shown) to the substrate 114 and the electrode 122 for connection to external circuitry.

The photovoltaic device 110, wherein the substrate was of stainless steel, the first layer 116 was approximately 500 Å in thickness and doped with phosphine which accounted for approximately 1% of the vacuum chamber 32 atmosphere, the second layer 117 had a thickness of approximately 1 micron, and the hydrogen to dichlorosilane ratio was 4.5:1, has been measured with an open circuit output voltage ($V_{oc}$) of approximately 477 millivolts and a short circuit current ($j_{sc}$) equal to approximately 400 microamps/cm$^2$. It has been found that a photovoltaic device very similar in structure to photovoltaic device 110 but having a body of sputtered amorphous silicon possessed an open circuit voltage of approximately 10 millivolts and a short circuit current of approximately 0.1 microamps/cm$^2$. The better open circuit voltage and short circuit current possessed by the present photovoltaic device attests to the fact that the amorphous silicon layer of the present invention has superior electronic properties to that of amorphous silicon fabricated by a sputtering process. Furthermore, it can readily be surmised from this data that the amorphous silicon layer of the present invention will also possess electronic properties superior to an amorphous silicon body fabricated by evaporation or chemical vapor deposition processes.

In the present invention, a body of amorphous silicon fabricated by a glow discharge in a gas atmosphere including hydrogen and a deposition gas having the elements silicon and a halogen selected from the group consisting of chlorine, bromine and iodine, can be utilized in photovoltaic, photodetection and current rectifying devices.

I claim:

1. A semiconductor device comprising:
   a layer of amorphous silicon having a semiconductor junction within said layer, said layer containing a halogen selected from the group consisting of chlorine, bromine and iodine, said halogen being present in an amount up to about 7 atomic percent.

2. The semiconductor device in accordance with claim 1 wherein said layer has a first layer of doped amorphous silicon and a second layer of amorphous silicon on a surface of said first layer.

3. The semiconductor device in accordance with claim 2 wherein a substrate is on a surface of said first layer opposite said second layer.

4. The semiconductor device in accordance with claim 3 wherein said substrate is electrically conductive.

5. The semiconductor device in accordance with claim 1 further comprising an electrically conductive substrate and an electrode on a portion of the surface of said layer.

6. A semiconductor device comprising:
   a layer of amorphous silicon on a substrate having a semiconductor junction at said layer wherein said layer has a first layer of doped amorphous silicon and a second layer of amorphous silicon on a surface of said first layer and wherein said layer contains a halogen selected from the group consisting of chlorine, bromine and iodine, said halogen being present in an amount up to about 7 atomic percent,
   a metallic film on a surface of said second layer providing a semiconductor junction at the interface of said metal film and said second layer, and
   an electrode on a portion of a surface of said metallic film.

7. The semiconductor device in accordance with claim 6 wherein said second layer is one micron or less in thickness and said metallic film is of a material having a work function of 4.5 eV or greater.

8. The semiconductor device in accordance with claim 7 wherein an antireflection layer is on said electrode and on the surface of said metallic film not occupied by said electrode and opposite said layer, said antireflection layer having a solar radiation incident surface opposite said metallic film.

9. The semiconductor device in accordance with claim 8 wherein the dopant concentration of said first layer is graded such that it is a maximum at the interface of said first layer and said substrate and decreases in the direction of the interface of said first and second layers.

10. The semiconductor device in accordance with claim 9 wherein the dopant concentration at the interface of said first and second layers is electrically insignificant.

11. The semiconductor device in accordance with claim 10 wherein the maximum dopant concentration is on the order of 5 atomic percent.

12. The semiconductor device in accordance with claim 8 wherein the dopant concentration of said first layer is substantially uniform through said first layer.

13. A semiconductor device comprising:
   a layer of amorphous silicon having a semiconductor junction within said layer, said layer containing a halogen selected from the group consisting of chlorine, bromine and iodine and said layer on a substrate prepared by;
   (a) exposing said substrate to a gas atmosphere containing hydrogen and a deposition gas containing silicon and a halogen selected from the group consisting of chlorine, bromine, and iodine, and (b) initiating a glow discharge.

14. The article in accordance with claim 13 wherein said gas atmosphere has a volume ratio of hydrogen to deposition gas 2:1 or greater.

15. The article in accordance with claim 14 wherein said deposition gas is dichlorosilane ($SiH_2Cl_2$).

16. The article in accordance with claim 14 wherein said deposition gas is chlorosilane ($SiH_3Cl$).

17. The article in accordance with claim 14 wherein said deposition gas is trichlorosilane ($SiHCl_3$).

18. The article in accordance with claim 14 wherein said deposition gas is bromosilane ($SiH_3Br$).

19. The article in accordance with claim 14 wherein said deposition gas is dibromosilane ($SiH_2Br_2$).

20. The article in accordance with claim 14 wherein said deposition gas is silicontetrachloride ($SiCl_4$).

21. The semiconductor device in accordance with claim 13 wherein said layer has a first layer of doped amorphous silicon and a second layer of amorphous silicon on a surface of said first layer.

22. The semiconductor device in accordance with claim 21 wherein said substrate is electrically conductive.

23. The semiconductor device in accordance with claim 13 further comprising an electrically conductive substrate and an electrode on a portion of the surface of said layer.

24. A semiconductor device according to claim 13 wherein the amorphous silicon layer is annealed at a temperature in the range of 200° C. to 400° C. for a period of from a few minutes to several hours.

25. A semiconductor device having a semiconductor junction comprising:
a layer of amorphous silicon said layer containing a halogen selected from the group consisting of bromine, chlorine, and iodine said layer situated on a substrate wherein said layer has a first layer of doped amorphous silicon and a second layer of amorphous silicon on a surface of said first layer, a metallic film on a surface of said second layer providing a semiconductor junction at the interface of said metallic film and said second layer, and an electrode on a portion of a surface of said metallic film prepared by;
(a) exposing said substrate to a gas atmosphere containing hydrogen and a deposition gas containing silicon and a halogen selected from the group consisting of chlorine, bromine and iodine, and
(b) initiating a glow discharge.

26. The semiconductor device in accordance with claim 25 further comprising the steps of depositing a metallic film on the formed amorphous silicon layer and depositing an electrode on the deposited metallic film.

27. In a method of fabricating a semiconductor device having a layer of amorphous silicon, said layer having a semiconductor junction within said layer, said layer containing a halogen selected from the group consisting of chlorine, bromine and iodine, said halogen being present in an amount up to about 7 atomic percent, the step of:
heating said device to a temperature in a range of 150° C. to 250° C. for a period of about 5 to 30 minutes.

28. In a method of fabricating a semiconductor device having a layer of a amorphous silicon, said layer having a semiconductor junction at said layer, said layer having a first layer of doped amorphous silicon and a second layer of amorphous silicon on a surface of said first layer and a metallic film on a surface of said second layer providing a semiconductor junction at the interface of said metallic film and said second layer, and an electrode on a portion of a surface of said metallic film, said layer containing a halogen selected from the group consisting of chlorine, bromine and iodine, said halogen being present in an amount up to about 7 atomic percent, the step of:
heating said device to a temperature in a range of 150° C. to 250° C. for a period of about 5 to 30 minutes.

29. An article comprising:
a substrate; and
a layer of amorphous silicon, fabricated by a glow discharge, deposited on said substrate, means for defining a rectifying junction within or at the surface of said layer, wherein said layer contains a halogen selected from the group consisting of chlorine, bromine and iodine in an amount up to about 7 atomic percent.

30. The article according to claim 29 wherein said layer has regions of differing conductivity.

* * * * *